US012604393B2

(12) United States Patent
Ishii et al.

(10) Patent No.: US 12,604,393 B2
(45) Date of Patent: Apr. 14, 2026

(54) ELECTRONIC CONTROL DEVICE AND GROUND LINE ROUTING METHOD

(71) Applicant: HITACHI ASTEMO, LTD., Hitachinaka (JP)

(72) Inventors: Akira Ishii, Hitachinaka (JP); Tomio Sakashita, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 328 days.

(21) Appl. No.: 18/261,250

(22) PCT Filed: Nov. 29, 2021

(86) PCT No.: PCT/JP2021/043558
§ 371 (c)(1),
(2) Date: Jul. 12, 2023

(87) PCT Pub. No.: WO2022/153690
PCT Pub. Date: Jul. 21, 2022

(65) Prior Publication Data
US 2024/0074034 A1     Feb. 29, 2024

(30) Foreign Application Priority Data
Jan. 14, 2021     (JP) ................................. 2021-004132

(51) Int. Cl.
*H05K 1/14*          (2006.01)
*H05K 1/02*          (2006.01)
(52) U.S. Cl.
CPC ............. *H05K 1/0218* (2013.01); *H05K 1/14* (2013.01); *H05K 2201/09345* (2013.01)

(58) Field of Classification Search
CPC ................... H05K 1/0218; H05K 1/14; H05K 2201/09345
(Continued)

(56) References Cited

U.S. PATENT DOCUMENTS

2009/0219227 A1*   9/2009   Takayama ................ H01J 11/12
345/60
2017/0272009 A1     9/2017   Kawamura et al.
(Continued)

FOREIGN PATENT DOCUMENTS

JP        2017-169405 A      9/2017
JP        2019-187077 A      10/2019
(Continued)

OTHER PUBLICATIONS

International Preliminary Report on Patentability dated Jul. 27, 2023 issued in International Patent Application No. PCT/JP2021/043558, with English translation, 14 pages.
(Continued)

*Primary Examiner* — Binh B Tran
(74) *Attorney, Agent, or Firm* — FOLEY & LARDNER LLP

(57)          ABSTRACT
An electronic control device includes a plurality of circuit boards that transmit signals to each other and a power supply connector for direct-current power. A ground line connected to a ground terminal of the power supply connector is connected to a ground of one of the plurality of circuit boards by way of a ground of another one of the plurality of circuit boards. In this way, the electronic control device including the plurality of circuit boards needs fewer noise reduction components while enabling easier routing of ground lines.

11 Claims, 9 Drawing Sheets

(58) Field of Classification Search
   USPC ........................................................ 361/784
   See application file for complete search history.

(56)                    References Cited

U.S. PATENT DOCUMENTS

| | | | |
|---|---|---|---|
| 2017/0358847 A1* | 12/2017 | Cho | ......................... H01Q 5/35 |
| 2019/0310150 A1 | 10/2019 | Horiba et al. | |
| 2019/0342989 A1* | 11/2019 | Toyama | ................... H05K 1/02 |
| 2020/0098816 A1* | 3/2020 | Matsumoto | ........... H10F 39/809 |
| 2020/0361416 A1 | 11/2020 | Ogura | |
| 2022/0264746 A1 | 8/2022 | Hara et al. | |

FOREIGN PATENT DOCUMENTS

| | | | |
|---|---|---|---|
| JP | 2020-005480 A | 1/2020 |
| WO | WO-2019/159492 A1 | 8/2019 |
| WO | WO-2021/002374 A1 | 1/2021 |

OTHER PUBLICATIONS

Notice of Reasons for Refusal dated Sep. 17, 2024 issued in JP Application No. 2022-575110, with machine-generated English translation, 10 pages.
International Search Report dated Feb. 22, 2022 issued in International Patent Application No. PCT/JP2021/043558, with English translation, 5 pages.

* cited by examiner

FRONT SURFACE

REAR SURFACE

CLOSELY
DISPOSED

CLOSELY
DISPOSED

ELECTRONIC CONTROL DEVICE AND GROUND LINE ROUTING METHOD

TECHNICAL FIELD

The present invention relates to an electronic control device including a plurality of circuit boards and to a ground line routing method.

BACKGROUND ART

In an electronic control device including a plurality of circuit boards, a ground of a direct-current power supply needs to be connected to each circuit board. Japanese Laid-open Patent Publication No. 2019-187077 A (Patent Document 1) discloses a technique as a method for connecting a ground of a direct-current power supply to each circuit board. In this technique, a ground line is branched inside a connector, to which a direct-current power harness is detachably connected, and the branched ground lines are connected to the grounds of their respective circuit boards.

REFERENCE DOCUMENT LIST

Patent Document

Patent Document 1: JP 2019-187077 A

SUMMARY OF THE INVENTION

Problem to be Solved by the Invention

When a ground line is connected to a circuit board, a noise reduction component such as a capacitor needs to be attached to this connection portion. In the above technique in which a ground line is branched inside the connector and the branched ground lines are connected to their respective circuit boards, there are a plurality of connection portions of the ground lines and their respective circuit boards, and therefore, a plurality of noise reduction components need to be attached to their respective connection portions. In this case, the routing of the ground lines in the electronic control device is complicated, and the mounting space is reduced by the attachment of these noise reduction components.

Thus, it is an object of the present invention to provide an electronic control device and a ground line routing method that need fewer noise reduction components while enabling easier routing of ground lines.

Means for Solving the Problem

An electronic control device includes: a plurality of circuit boards that transmit signals to each other; and a power supply connector for direct-current power. In addition, a ground line connected to a ground terminal of the power supply connector is connected to a ground of one of the plurality of circuit boards via a ground of another one of the plurality of circuit boards.

Effects of the Invention

According to the present invention, an electronic control device including a plurality of circuit boards needs fewer noise reduction components while enabling easier routing of ground lines.

BRIEF DESCRIPTION OF THE DRAWINGS

FIG. 3 is a perspective view illustrating an example of the internal structure of an electronic control device.

FIG. 4 is a plan view illustrating an example of a connector unit.

FIG. 11 is a longitudinal sectional view illustrating a second example of the line arrangement for reducing noise.

FIG. 12 is a longitudinal sectional view illustrating a third example of the line arrangement for reducing noise.

FIG. 13 is a schematic circuit diagram illustrating an example of a control system of the electric steering system.

MODE FOR CARRYING OUT THE INVENTION

Hereinafter, some examples for implementing the present invention will be described in detail with reference to the accompanying drawings.

Figure 1:
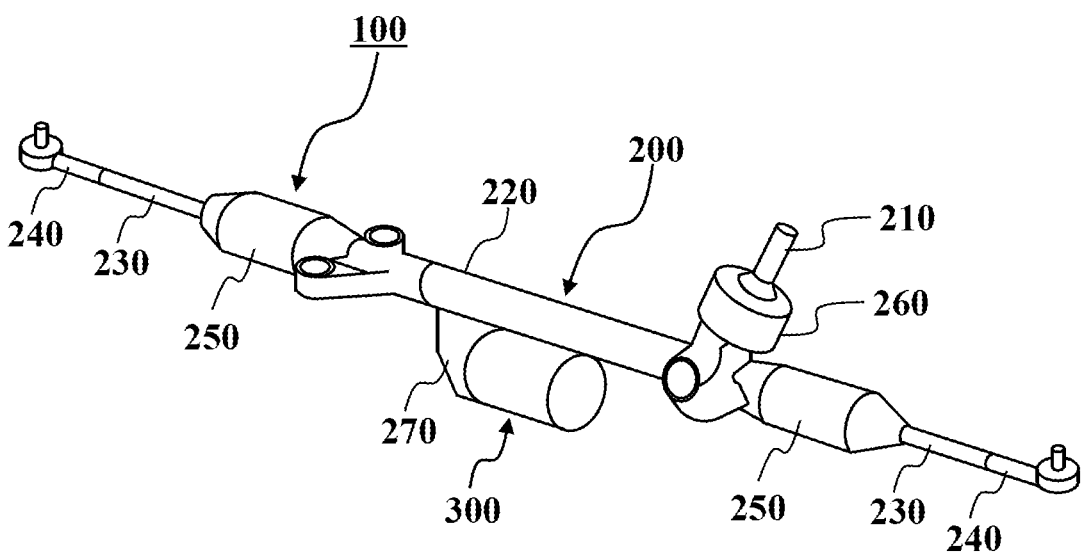
FIG. 1 is a perspective view illustrating an example of an electric steering system.

FIG. 1 illustrates an example of an electric power steering system 100, which is an application example of the present example, and which is mounted on a vehicle such as a passenger car, a bus, a truck, or a construction machine.

Electric power steering system 100 includes a rack-and-pinion type steering gear box 200 and a motor unit 300 that assists the operating force of a steering wheel operated by a driver.

Steering gear box 200 includes an input shaft 210 to which the steering wheel is coupled via a steering shaft, a pinion (not illustrated) fixed to an end portion of input shaft 210, a rack (not illustrated) that extends in the lateral direction and engages with the pinion, and a gear housing 220 that stores the pinion and the rack. A tie rod 230 is coupled to each end portion of the rack, and a tie rod end 240 coupled to a knuckle arm of a steering knuckle is coupled to an end portion of each tie rod 230. A rubber boot 250 that is extendable in the lateral direction is attached to each end portion of the gear housing 220 so as to prevent entry of foreign matter such as rainwater and dust into gear housing 220. In addition, a torque sensor 260 that detects a steering torque as the operating force of the steering wheel operated by the driver is attached to a middle portion of input shaft 210.

An attachment portion 270 is formed at a predetermined location on gear housing 220. Motor unit 300 is attached to attachment portion 270 such that the axis line of motor unit 300 is approximately parallel to the axis line of gear housing 220. Attachment portion 270 is formed on a protruding surface that matches the outer shape of the joint surface of motor unit 300, and a speed reducer and a ball nut gear (not illustrated) that transfer the rotating force of motor unit 300 to the rack while reducing the speed are disposed inside attachment portion 270.

Figure 2:
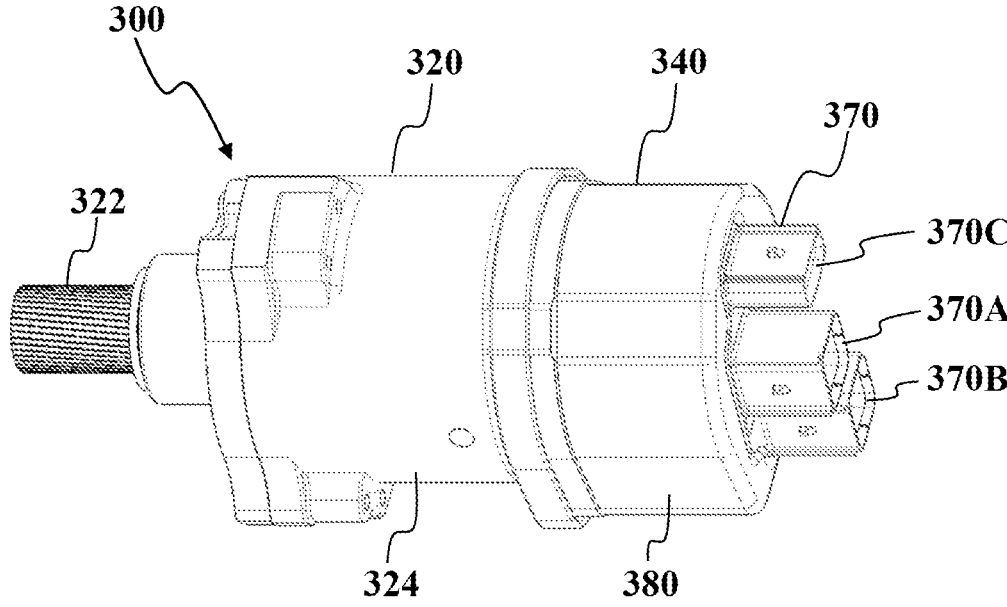
FIG. 2 is a perspective view illustrating an example of a motor unit.

As illustrated in FIG. 2, motor unit 300 includes a motor 320 such as a brush motor or a brushless motor, and an electronic control device 340 including electronic circuits that control and drive motor 320. Electronic control device 340 is integrally attached to the rear surface of motor 320, that is, to the rear surface located opposite to the joint surface connected to steering gear box 200. An output shaft 322 of motor 320 is coupled to the speed reducer and the ball nut gear that are disposed in attachment portion 270 of gear housing 220, and the rotating force is transferred to the rack by output shaft 322. Electronic control device 340 may be provided separately from motor unit 300.

Motor 320 of motor unit 300 includes a stator (not illustrated) having two systems of coils, a rotor (not illustrated) integrated with output shaft 322, and a housing 324 that stores the stator and the rotor. Thus, motor 320 of motor unit 300 is driven by at least one of the two systems of coils. That is, even when a failure or the like occurs in one of the two systems of coils, motor 320 is able to assist the operating force of the steering wheel operated by the driver.

Figures 3, 4:
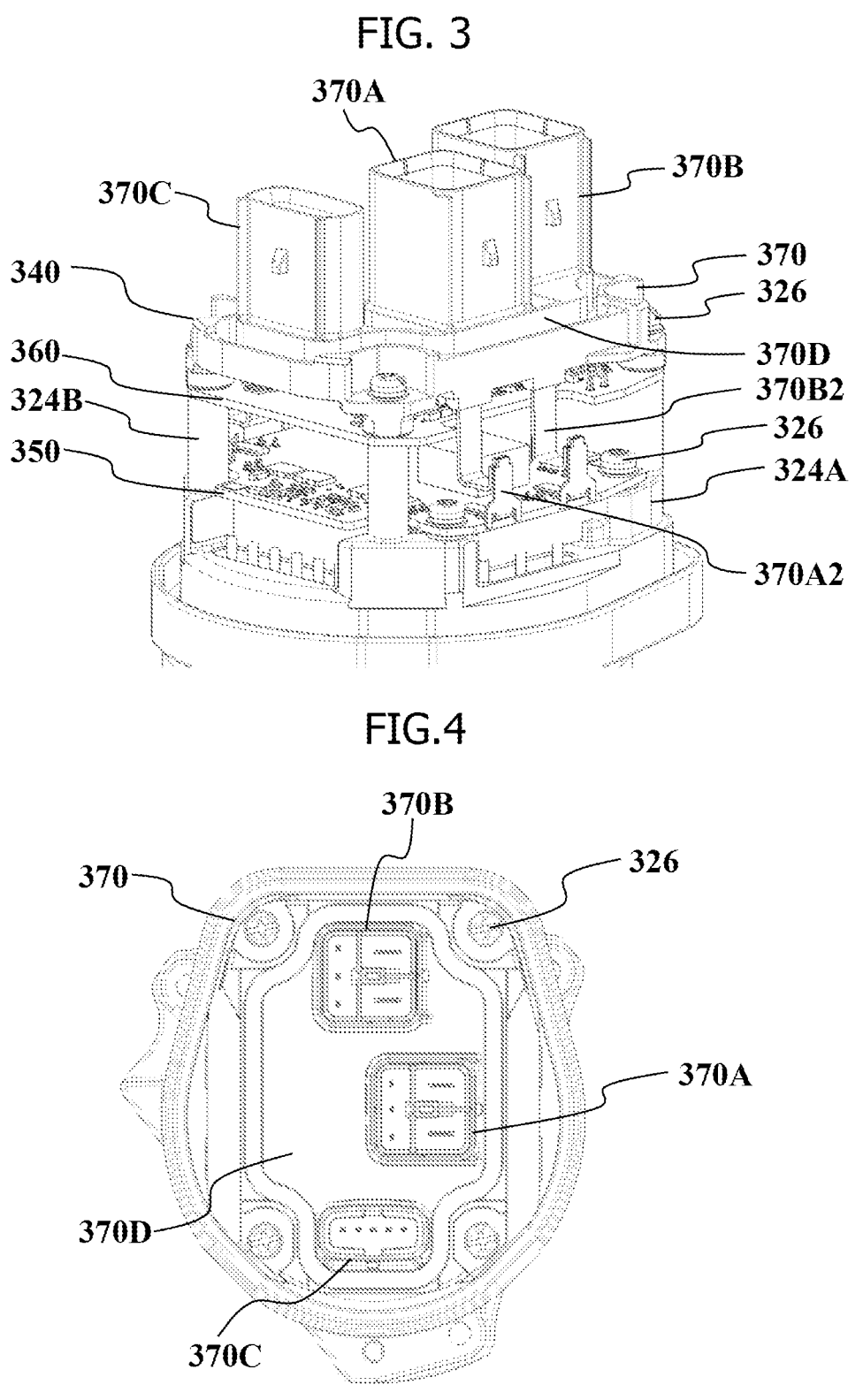

As illustrated in FIGS. 2 to 4, electronic control device 340 of motor unit 300 includes a power supply board 350 and a control board 360 that transmit signals to each other, a connector unit 370 for supplying direct-current power and control signals to power supply board 350 and control board 360, and a cover 380 that stores power supply board 350 and control board 360. Power supply board 350 and control board 360 are connected with each other, for example, by lead wires, flexible cables, or B-to-B connectors (board-to-board connectors) such that various signals, etc., can be transmitted mutually. Power supply board 350 and control board 360 are detachably fastened by screws 326 to bosses 324A and 324B, each being formed on a bottom wall portion of housing 324 of motor 320.

Figure 5:
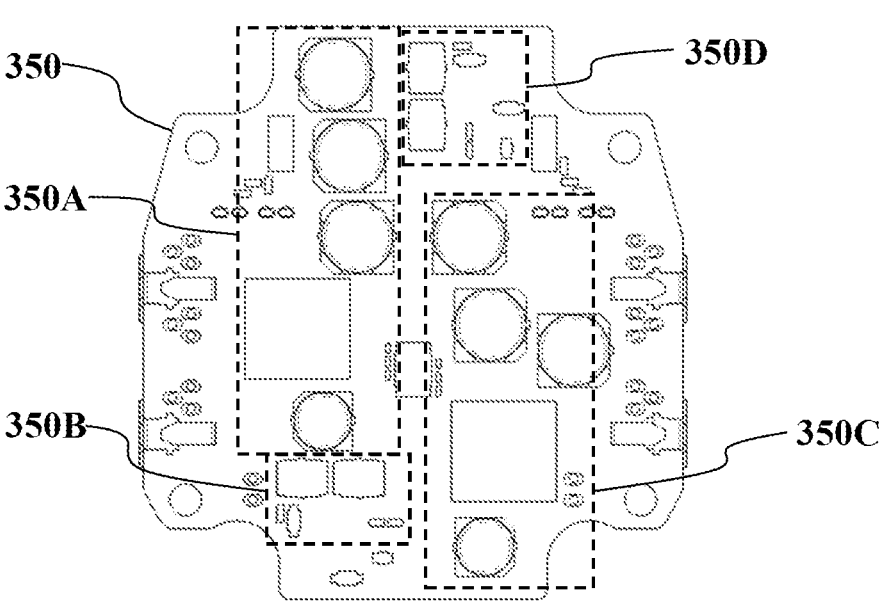
FIG. 5 is a plan view illustrating an example of electronic components mounted on the front surface of a power supply board.
Figure 6:
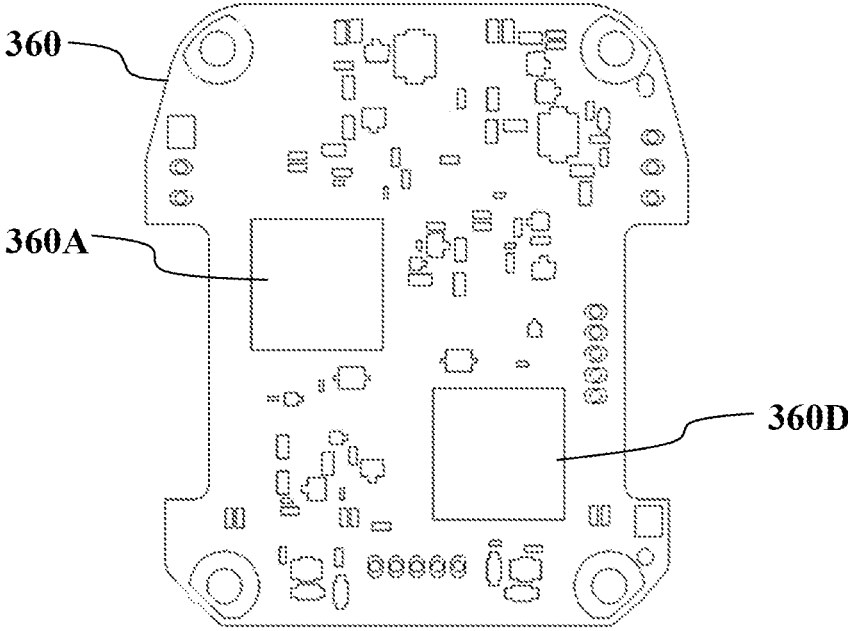
FIG. 6 is a plan view illustrating an example of electronic components mounted on the front surface of a control board.
Figure 7:
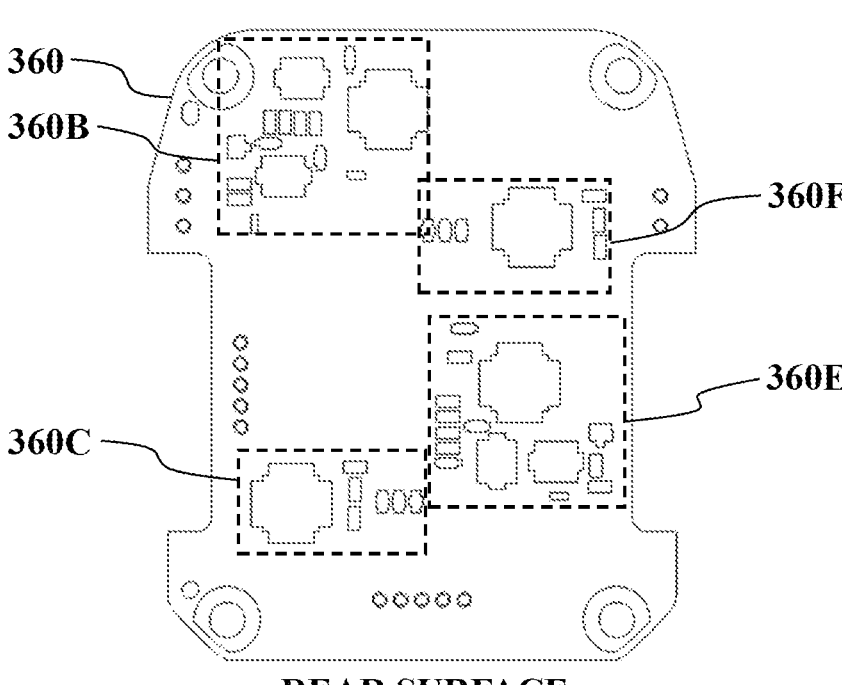
FIG. 7 is a plan view illustrating an example of electronic components mounted on the rear surface of the control board.

As illustrated in FIG. 5, a smoothing circuit 350A and an inverter circuit 350B in a first system and a smoothing circuit 350C and an inverter circuit 350D in a second system are mounted on the front surface of power supply board 350, to realize a redundant configuration. As illustrated in FIGS. 6 and 7, a microcomputer 360A, a power supply circuit 360B, and an inverter drive signal generation circuit 360C in the first system and a microcomputer 360D, a power supply circuit 360E, and an inverter drive signal generation circuit 360F in the second system are mounted on the front surface and the rear surface of control board 360, to realize a redundant configuration. First-system inverter drive signal generation circuit 360C and second-system inverter drive signal generation circuit 360F on control board 360 are configured to supply drive signals to first-system inverter circuit 350B and second-system inverter circuit 350D on power supply board 350, respectively, via busbars (not illustrated) or the like.

Connector unit 370 includes a power supply connector 370A to which a direct-current power harness in the first system is detachably connected, a power supply connector 370B to which a direct-current power harness in the second system is detachably connected, and a control connector 370C to which a harness for transmitting control signals in the first system and the second system is detachably connected. First-system power supply connector 370A, second-system power supply connector 370B, and control connector 370C are formed to stand integrally on one surface of a connector base 370D having a flat plate shape, for example.

Cover 380 has a cylindrical shape with a bottom with one end that is open in the axial direction, and this open-end portion is press-fitted and fixed to a recessed groove formed on the outer peripheral surface of housing 324 of motor 320. In the bottom wall portion of cover 380, openings that match the outer shapes of first-system power supply connector 370A, second-system power supply connector 370B, and control connector 370C of connector unit 370 are formed such that these connectors are exposed to the outside. It is desirable that the sealing be made between cover 380 and housing 324 of motor 320 by using, for example, liquid packing, so as to prevent entry of foreign matter such as water and dust into cover 380.

In electric power steering system 100, when the driver operates the steering wheel, input shaft 210 rotates via the steering shaft, the pinion fixed to the end portion of input shaft 210 rotates, and the rack consequently slides rightward or leftward. When the rack slides rightward or leftward, the sliding force is transferred to the steering arm of the steering knuckle via tie rods 230 and tie rod ends 240, and steered wheels rotate around the axis of a kingpin. In this way, the steering is performed.

Electronic control device 340 determines the operation direction (rotation direction) of the steering wheel based on the steering torque detected by torque sensor 260 and calculates the operation amount of motor 320 that assists the operating force by the driver based on the steering torque and the vehicle velocity. Next, electronic control device 340 assists the operating force by supplying a driving current based on the operation amount of motor 320 to the coils of the stator and by rotating output shaft 322 of motor 320. Electronic control device 340 performs feedback control on motor 320 by using the output signal from a rotation angle sensor provided in motor 320.

Figure 8:
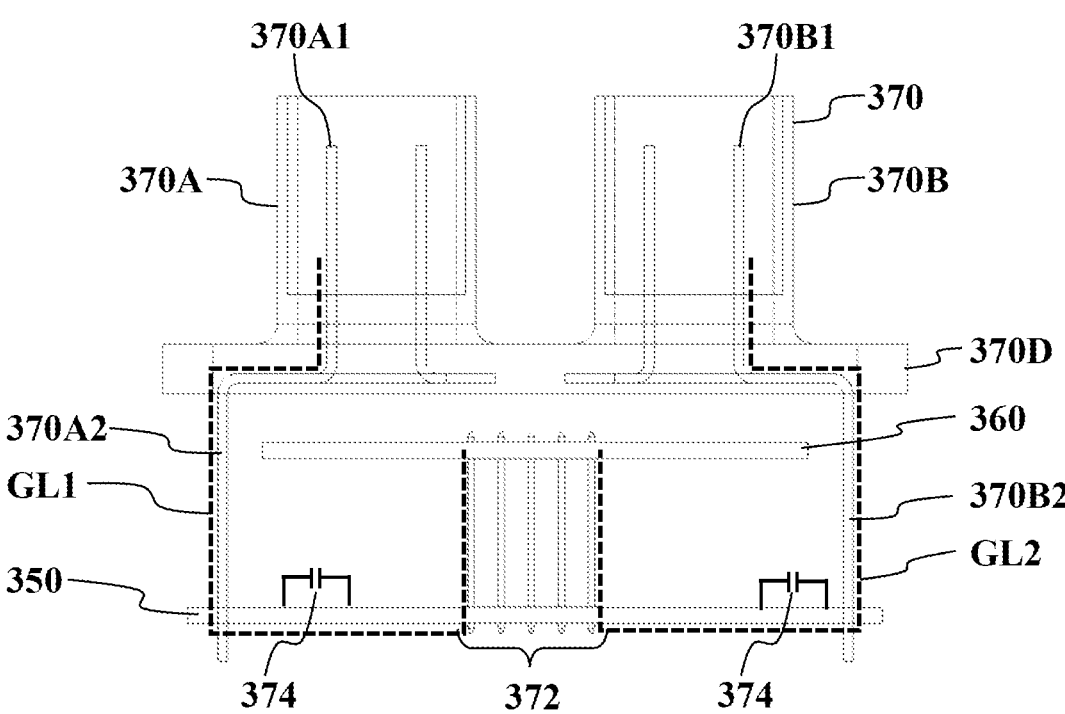
FIG. 8 is a longitudinal sectional view illustrating an example of the routing layout of ground lines.

As illustrated in FIG. 8, a ground terminal 370A1 of power supply connector 370A in the first system is connected to a first-system ground (not illustrated) of power supply board 350 via a busbar 370A2. This busbar 370A2 extends through the inside of connector base 370D of connector unit 370 and bends toward power supply board 350. In addition, the first-system ground of power supply board 350 is connected to a first-system ground (not illustrated) of control board 360 via a signal transmission path for mutually transmitting signals between power supply board 350 and control board 360. In the example illustrated in FIG. 8, the signal transmission path is one of a plurality of lead wires 372 (for example, a lead wire 372 located as the leftmost lead wire). Thus, ground terminal 370A1 of power supply connector 370A in the first system is connected to the first-system ground of control board 360 by way of the first-system ground of power supply board 350, via a ground line GL1 indicated by a dashed line in FIG. 8. The ground line GL1 is constituted by busbar 370A2, the first-system ground of power supply board 350, and the above lead wire 372. In addition, a capacitor 374 having a predetermined capacitance is disposed between busbar 370A2 and the first-system ground of power supply board 350. Capacitor 374 is an example of a noise reduction component.

As illustrated in FIG. 8, a ground terminal 370B1 of power supply connector 370B in the second system is connected to a second-system ground (not illustrated) of power supply board 350 via a busbar 370B2. This busbar 370B2 extends through the inside of connector base 370D of connector unit 370 and bends toward power supply board 350. In addition, the second-system ground of power supply board 350 is connected to a second-system ground (not illustrated) of control board 360 via a signal transmission path for mutually transmitting signals between the power supply board 350 and control board 360. In the example illustrated in FIG. 8, this signal transmission path is one of the plurality of lead wires 372 (for example, a lead wire 372 located as the rightmost lead wire). Thus, ground terminal 370B1 of power supply connector 370B in the second system is connected to the second-system ground of control board 360 by way of the second-system ground of power supply board 350, via a ground line GL2 indicated by a dashed line in FIG. 8. The ground line GL2 is constituted by busbar 370B2, the second-system ground of power supply board 350, and the above lead wire 372. In addition, a capacitor 374 having a predetermined capacitance is disposed between busbar 370B2 and the second-system ground of power supply board 350. Capacitor 374 is an example of a noise reduction component. It is desirable that the first-system ground and the second-system ground of power supply board 350 be insulated from each other.

With the above configuration, ground line GL1 connected to ground terminal 370A1 of power supply connector 370A in the first system is connected to the first-system ground of control board 360 by way of the first-system ground of power supply board 350. Furthermore, because the noise is reduced by capacitor 374 disposed at the connection point where first-system ground line GL1 is connected to power supply board 350, the noise superimposed on the current flowing through lead wire 372 connecting the first-system ground of power supply board 350 and the first-system ground of control board 360 is reduced. Therefore, there is no need to dispose a noise reduction component at the connection point where first-system ground line GL1 is connected to control board 360. That is, as compared with conventional techniques, the present example needs fewer noise reduction components while enabling easier routing of ground line GL1. Furthermore, since the present example needs fewer noise reduction components, the present example achieves reduction in cost and size of electronic control device 340, and effective utilization of the mounting space for electronic components on the circuit boards. The operations and effects in the second system are the same as the above-described operations and effects in the first system, and therefore, description thereof is omitted.

Figures 9, 10:
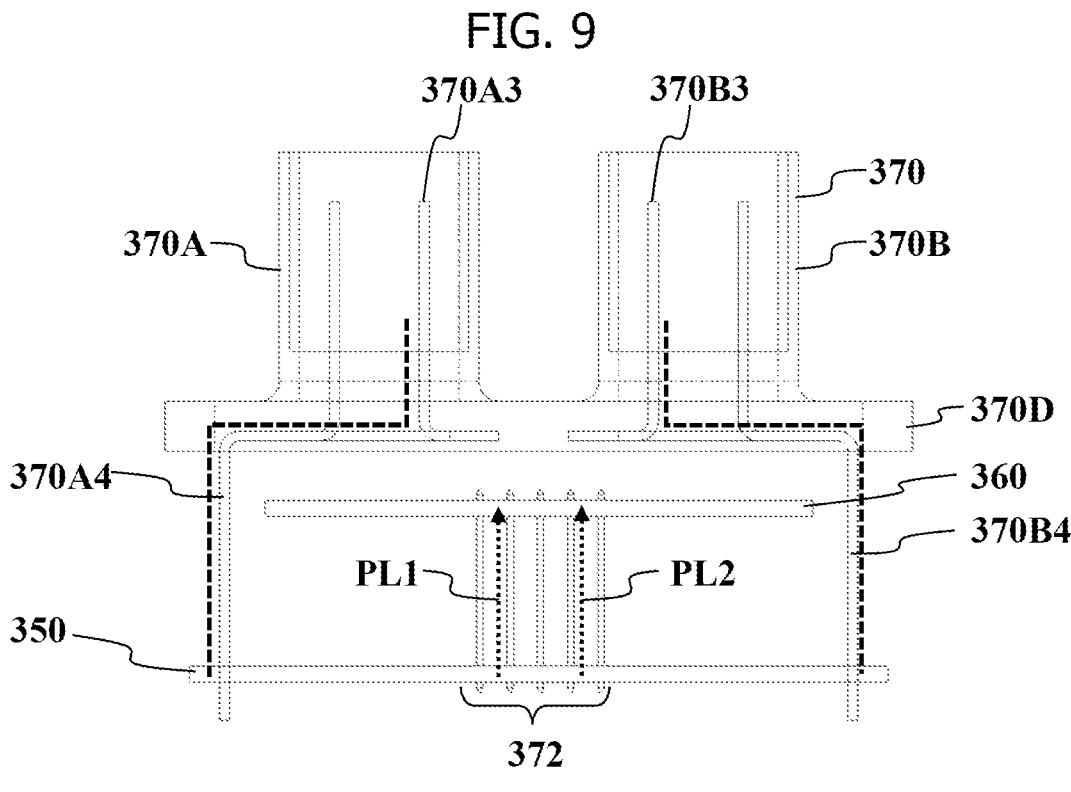
FIG. 9 is a longitudinal sectional view illustrating an example of power supply voltage paths from power supply terminals to the control board.
FIG. 10 is a longitudinal sectional view illustrating a first example of line arrangement for reducing noise.

As illustrated in FIG. 9, a power supply terminal 370A3 of power supply connector 370A in the first system is connected to first-system smoothing circuit 350A of power supply board 350 via a busbar 370A4. This busbar 370A4 extends through the inside of connector base 370D of connector unit 370 and bends toward power supply board 350 (see a dashed line on the left in FIG. 9). A power supply voltage smoothed by first-system smoothing circuit 350A of power supply board 350 is supplied to the first system of control board 360 via a power supply line PL1, which is one of the plurality of lead wires 372 (for example, a lead wire 372 located second from the left). Thus, the power supply voltage supplied to power supply terminal 370A3 of power supply connector 370A in the first system is supplied to first-system smoothing circuit 350A of power supply board 350 via busbar 370A4 and is then smoothed. The smoothed power supply voltage is supplied to the first system of control board 360 via power supply line PL1. In short, power supply terminal 370A3 of power supply connector 370A in the first system is connected only to the first system of power supply board 350 to which first-system ground terminal 370A1 is directly connected via busbar 370A2.

As illustrated in FIG. 9, a power supply terminal 370B3 of power supply connector 370B in the second system is connected to second-system smoothing circuit 350C of power supply board 350 via a busbar 370B4. This busbar 370B4 extends through the inside of connector base 370D of connector unit 370 and bends toward power supply board 350 (see dashed line on right in FIG. 9). A power supply voltage smoothed by second-system smoothing circuit 350C of power supply board 350 is supplied to the second system of control board 360 via a power supply line PL2, which is one of the plurality of lead wires 372 (for example, second lead wire 372 located second from right). Thus, the power supply voltage supplied to power supply terminal 370B3 of power supply connector 370B in the second system is supplied to second-system smoothing circuit 350C of power supply board 350 via busbar 370B4 and is then smoothed. The smoothed power supply voltage is supplied to the second system of control board 360 via power supply line PL2. In short, power supply terminal 370B3 of power supply connector 370B in the second system is connected only to the second system of power supply board 350 to which second-system ground terminal 370B1 is directly connected via busbar 370B2.

As illustrated in FIG. 10, among the plurality of lead lines 372 for mutually transmitting signals between power supply board 350 and control board 360, ground line GL1 and power supply line PL1 in the first system may be disposed close to each other, and ground line GL2 and power supply line PL2 in the second system may be disposed close to each other. In this way, the direction of the current flowing through first-system ground line GL1 is opposite from that of the current flowing through first-system power supply line PL1. Thus, the noises superimposed on their respective currents cancel each other and are consequently reduced. As a result, for example, the noise resistance performance in the first system can be improved. Similarly, the direction of the current flowing through second-system ground line GL2 is opposite from that of the current flowing through second-system power supply line PL2. Thus, the noises superimposed on their respective currents cancel each other and are consequently reduced. As a result, for example, the noise resistance performance in the second system can be improved.

In addition, ground line GL1 and power supply line PL1 in the first system may be disposed with an interval therebetween, the interval being smaller than the thickness (plate thickness) of any one of power supply board 350 and control board 360. Ground line GL2 and power supply line PL2 in the second system may also be disposed in the same manner. In this way, because the noises having large amplitudes and opposite phases interfere with each other and cancel each other, the noises are further reduced. As a result, the noise resistance performance can be further improved.

Figures 11, 12:
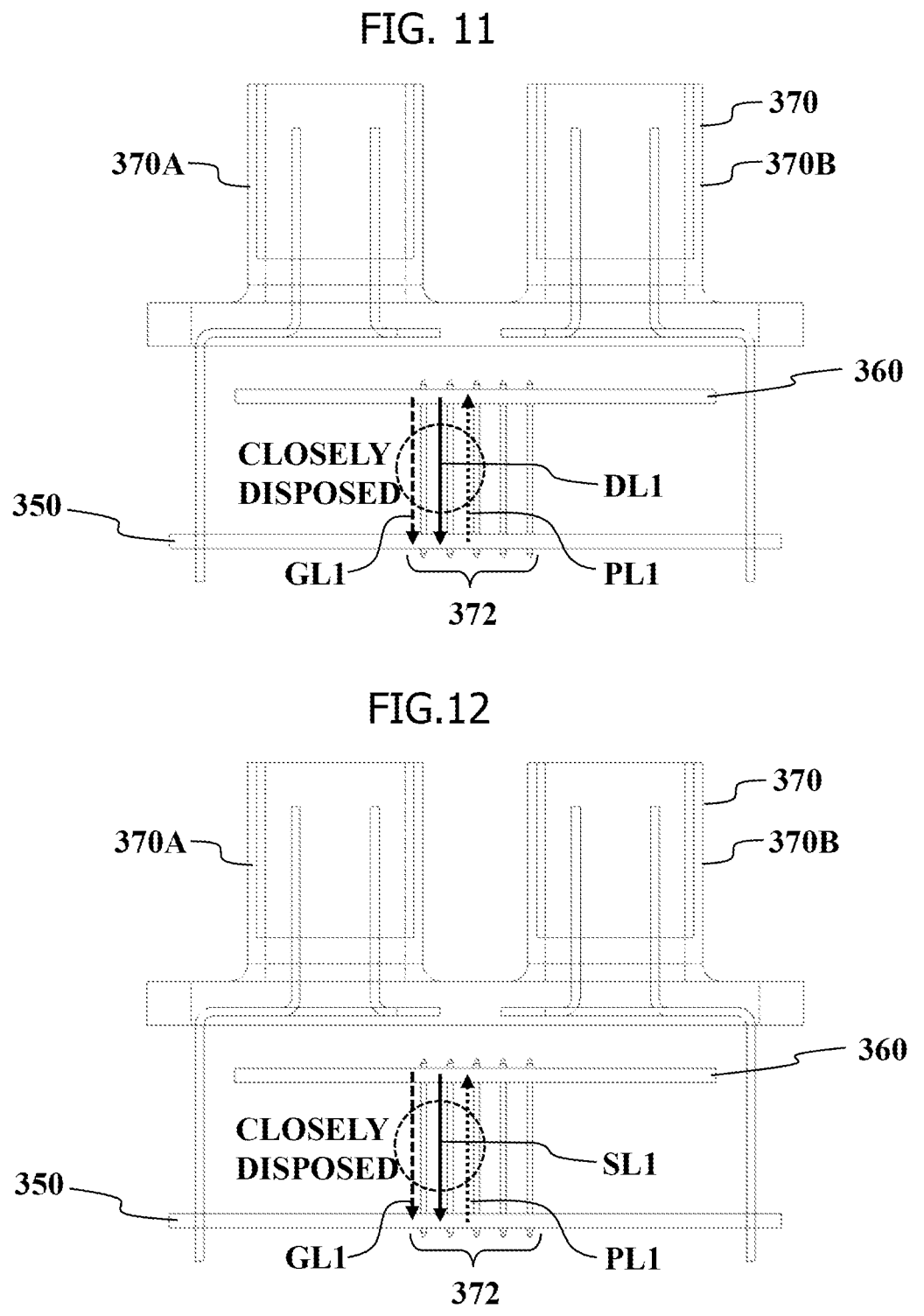

On control board 360, the power supply voltage needs to be dropped to a predetermined voltage by using first-system power supply circuit 360B and second-system power supply circuit 360E. The predetermined voltage needs to be supplied to power supply board 350. In this case, as illustrated in FIG. 11, it is desirable that power supply line PL1, ground line GL1, and a dropped voltage line DL1 for supplying the dropped voltage from control board 360 to power supply board 350 in the first system be disposed close to each other among the plurality of lead wires 372. In this way, the direction of the current flowing through power supply line PL1 from power supply board 350 to control board 360 is opposite from those of the currents flowing through dropped voltage line DL1 and ground line GL1 from control board 360 to power supply sub 350. Thus, the noises superimposed on the former current and the latter currents cancel each other and are consequently reduced. Furthermore, power supply line PL1, ground line GL1, and dropped voltage line DL1 may be disposed with an interval therebetween, the interval being smaller than the thickness (plate thickness) of any one of power supply board 350 and control board 360. In this way the noises can be effectively reduced. The same applies to the second system.

In addition, on control board 360, a drive signal having a voltage approximately equal to the, power supply voltage the drive signal driving first-system driving inverter circuit 350B, and second-system inverter circuit 350D of power supply board 350, needs to be generated by using first-system inverter drive signal generation circuit 360C and second-system inverter drive signal generation circuit 360F. The generated drive signal needs to be supplied to power supply board 350. In this case, as illustrated in FIG. 12, it is desirable that power supply line PL1, ground line GL1, and a signal line SL1 for supplying the drive signal from control board 360 to power supply board 350 in the first system be disposed close to each other among the plurality of lead wires 372. In this way, the direction of the current flowing through power supply line PL1 from power supply board 350 to control board 360 is opposite from those of the currents flowing through signal line SL1 and ground line GL1 from control board 360 to power supply board 350, and these lines have the same voltage. Thus, the noises superimposed on the former current and the latter currents cancel each other and are consequently reduced. Furthermore, power supply line PL1, ground line GL1, and signal line SL1 may be disposed with an interval therebetween, the interval being smaller than the thickness (plate thickness) of any one of power supply board 350 and control board 360. In this way, the noises can be effectively reduced. The same applies to the second system.

Figure 13:
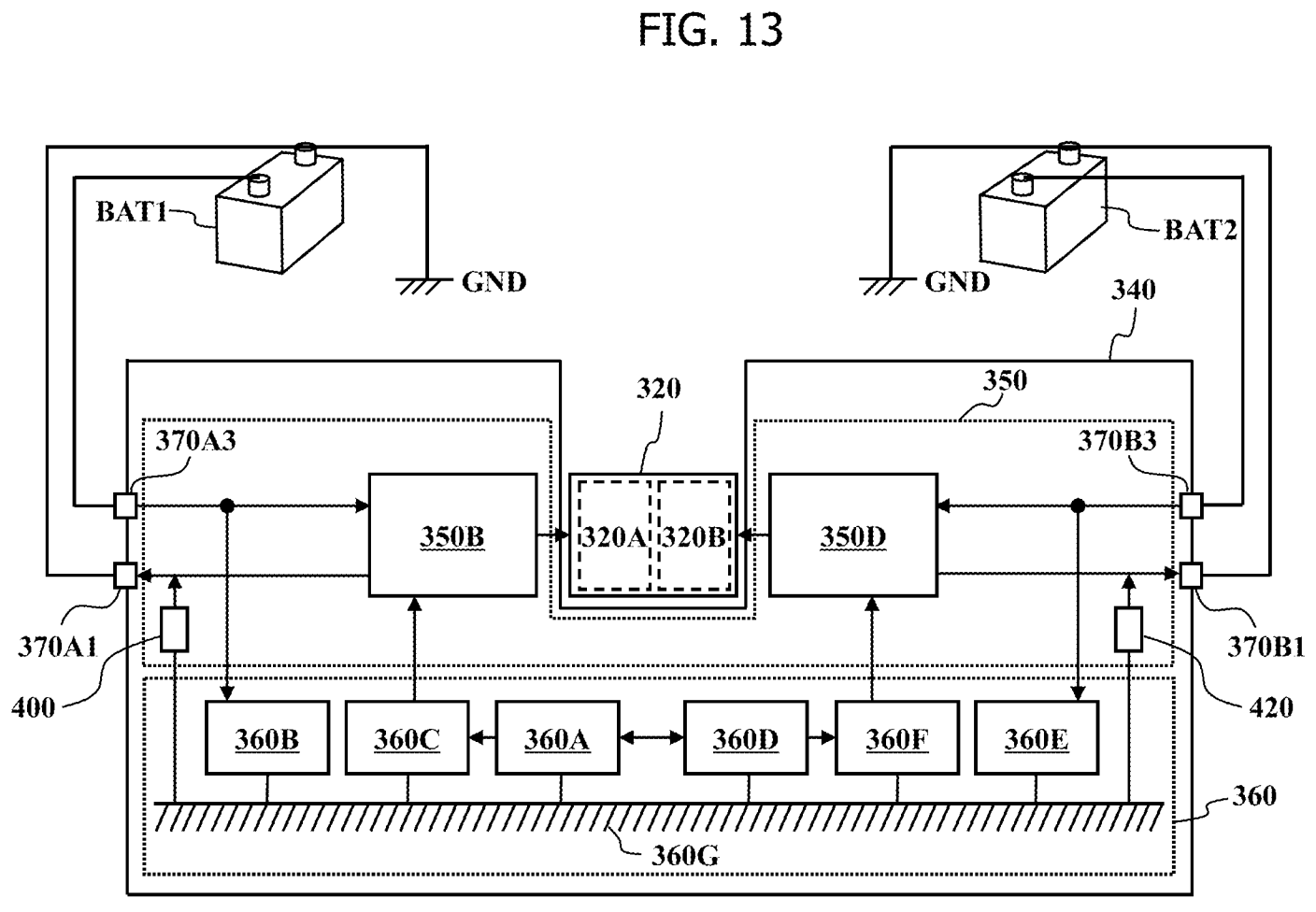

FIG. 13 is a schematic circuit diagram illustrating a control system of electronic control device 340 based on the various examples described above. Electronic control device 340 includes a common ground 360G to which the first-system grounds and the second-system grounds of control board 360 are connected. The stator of motor 320 in motor unit 300 includes a first coil 320A driven and controlled by first-system inverter circuit 350B and a second coil 320B driven and controlled by second-system inverter circuit 350D. The control system of motor 320 is divided into a first system and a second system, as will be described in detail below.

First System

A ground terminal and a power supply terminal of a battery BAT1, which is an example of a direct-current power supply, are connected to ground terminal 370A1 and power supply terminal 370A3 of power supply connector 370A, respectively. Ground terminal 370A1 of power supply connector 370A is connected to a ground terminal of inverter circuit 350B mounted on power supply board 350, and is also connected to common ground 360G of control board 360. Power supply terminal 370A3 of power supply connector 370A is connected to a power supply terminal of inverter circuit 350B mounted on power supply board 350, and is also connected to a power supply terminal of power supply circuit 360B mounted on control board 360. Inverter circuit 350B mounted on power supply board 350 outputs a drive current to first coil 320A of motor 320. Power supply circuit 360B of control board 360 supplies direct-current power of a predetermined voltage to microcomputer 360A and inverter drive signal generation circuit 360C.

Each of the ground terminals of microcomputer 360A, power supply circuit 360B, and inverter drive signal generation circuit 360C mounted on control board 360 is connected to common ground 360G. Microcomputer 360A mounted on control board 360 outputs a control signal to inverter drive signal generation circuit 360C and is connected to microcomputer 360D in the second system. Thus, microcomputer 360A in the first system is configured to transmit various signals to microcomputer 360D in the second system (and vice versa). Inverter drive signal generation circuit 360C mounted on control board 360 outputs a drive signal to inverter circuit 350B mounted on power supply board 350 based on a control signal from microcomputer 360A.

Second System

A ground terminal and a power supply terminal of a battery BAT2, which is an example of a direct-current power supply, are connected to ground terminal 370B1 and power supply terminal 370B3 of power supply connector 370B, respectively. Ground terminal 370B1 of power supply connector 370B is connected to a ground terminal of inverter circuit 350D mounted on power supply board 350, and is also connected to common ground 360G of control board 360. Power supply terminal 370B3 of power supply connector 370B is connected to a power supply terminal of inverter circuit 350D mounted on power supply board 350, and is also connected to a power supply terminal of power supply circuit 360E mounted on control board 360. Inverter circuit 350D mounted on power supply board 350 outputs a drive current to second coil 320B of motor 320. Power supply circuit 360E of control board 360 supplies direct-current power of a predetermined voltage to microcomputer 360D and inverter drive signal generation circuit 360F.

The ground terminals of microcomputer 360D, power supply circuit 360E, and inverter drive signal generation circuit 360F mounted on control board 360 are connected to common ground 360G. Microcomputer 360D mounted on control board 360 outputs a control signal to inverter drive signal generation circuit 360F. Inverter drive signal generation circuit 360F mounted on control board 360 outputs a drive signal to inverter circuit 350D mounted on power supply board 350 based on a control signal from microcomputer 360D.

Figure 14:
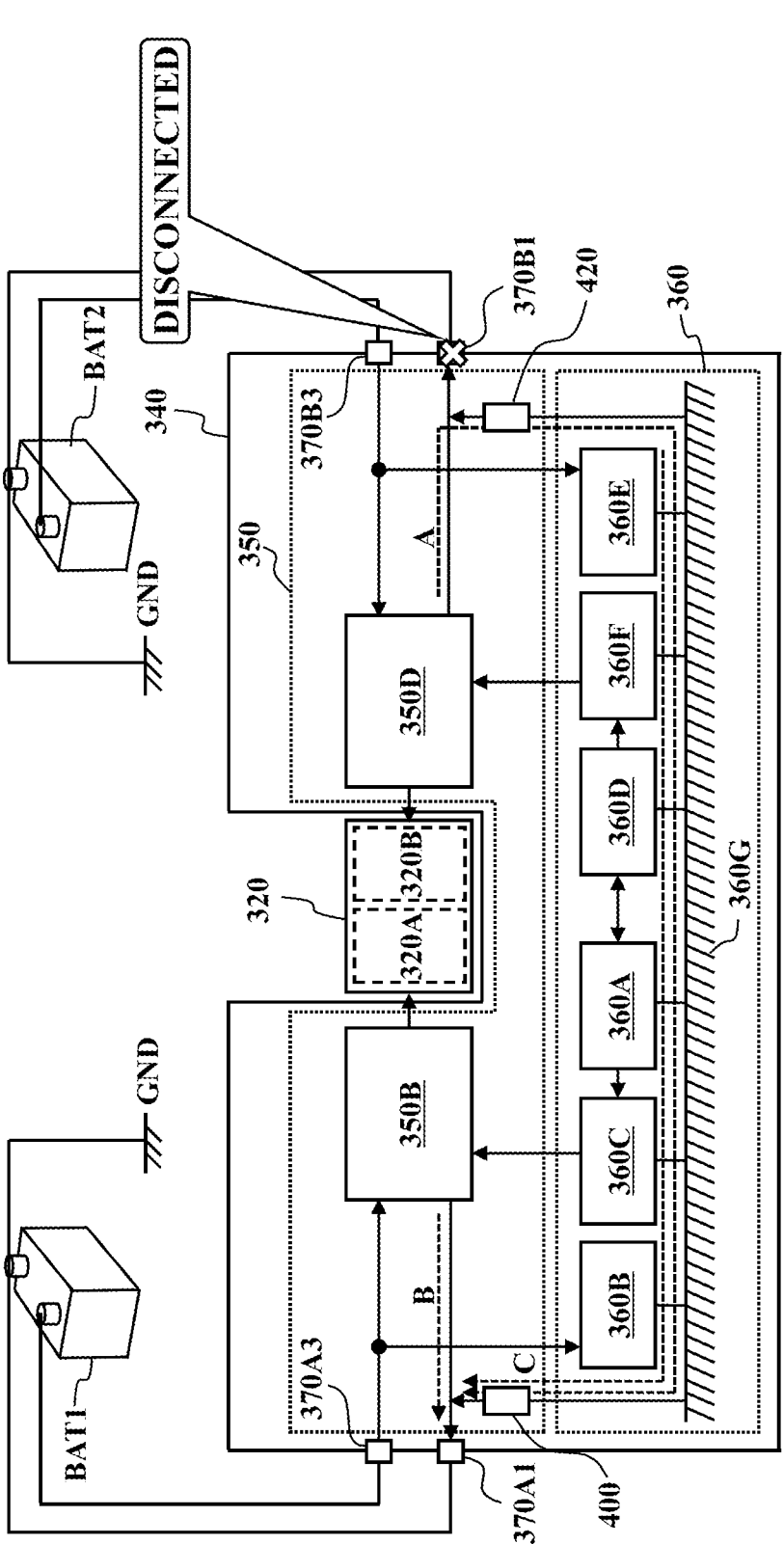
FIG. 14 illustrates paths of ground currents that flow when a ground in a second system is disconnected.

The following description will be given of the currents that flow through the ground lines in the circuit illustrated in FIG. 13, when any one of the grounds of first-system power supply connector 370A and second-system power supply connector 370B is disconnected. For example, as illustrated in FIG. 14, when ground terminal 370B1 of power supply connector 370B in the second system is disconnected, the ground current flowing from inverter circuit 350D of power supply board 350 in the second system cannot return to battery BAT2. In this case, as indicated by a dashed line A in FIG. 14, the ground current flowing from inverter circuit 350D of power supply board 350 flows into the ground line in the first system via an electric path connecting the ground of power supply board 350 and common ground 360G of control board 360 and common ground 360G.

Normally, a ground current (indicated by a dashed line B in FIG. 14) flowing from inverter circuit 350B of power supply board 350 and a ground current (indicated by a dashed line C in FIG. 14) flowing from microcomputer 360A, power supply circuit 360B, and inverter drive signal generation circuit 360C of control board 360 flow through the ground line in the first system. However, when a disconnection occurs in ground terminal 370B1 of power supply connector 370B in the second system and when the ground current in the second system additionally flows through the ground line in the first system, the ground currents A, B, and C described above flow into ground terminal 370A1 of power supply connector 370A in the first system. As a result, for example, the rated power supply capacity is exceeded. This causes a failure in normal power supply connector 370A as well, and for example, a sudden loss of assist may occur in electric power steering system 100. Similarly, when ground terminal 370A1 of power supply connector 370A in the first system is disconnected, an excessively large current also flows through the ground line in the second system.

For this reason, the occurrence of disconnection in any one of the grounds of first-system power supply connector 370A and second-system power supply connector 370B needs to be detected, and the operation of the inverter circuit in the system in which the disconnection has occurred needs to be stopped, so as to avoid the occurrence of a failure in the normal power supply connector.

Thus, as illustrated in FIGS. 13 and 14, for example, current detection elements 400 and 420, such as shunt resistors, are disposed on electric paths (on ground lines) connecting the ground of power supply board 350 and common ground 360G of control board 360 in the first system and the second system. First-system microcomputer 360A and second-system microcomputer 360D constantly monitor the outputs from current detection elements 400 and 420. If any of the outputs is equal to or greater than a predetermined value, first-system microcomputer 360A or second-system microcomputer 360D stops the operation of the corresponding inverter circuit. Upon detecting a failure, the microcomputer in the system in which the failure has occurred notifies the microcomputer in the normal system of the occurrence of the failure and, as necessary, requests the microcomputer in the normal system to take over the control of motor 320. In this way, the robustness of the function of detecting ground disconnection can be improved. As described above, even when a failure occurs in one of the two systems, motor 320 is continuously controlled by the other normal system. Therefore, the function of electric power steering system 100 is not impaired.

In the examples described above, motor 320 in motor unit 300 and electronic control device 340 have a redundant configuration. However, the present invention is also applicable to a motor and an electronic control device that do not have a redundant configuration. In this case, motor 320 has only one coil, and power supply board 350 and control board 360 in electronic control device 340 have a control system having only a single system.

Figure 15:
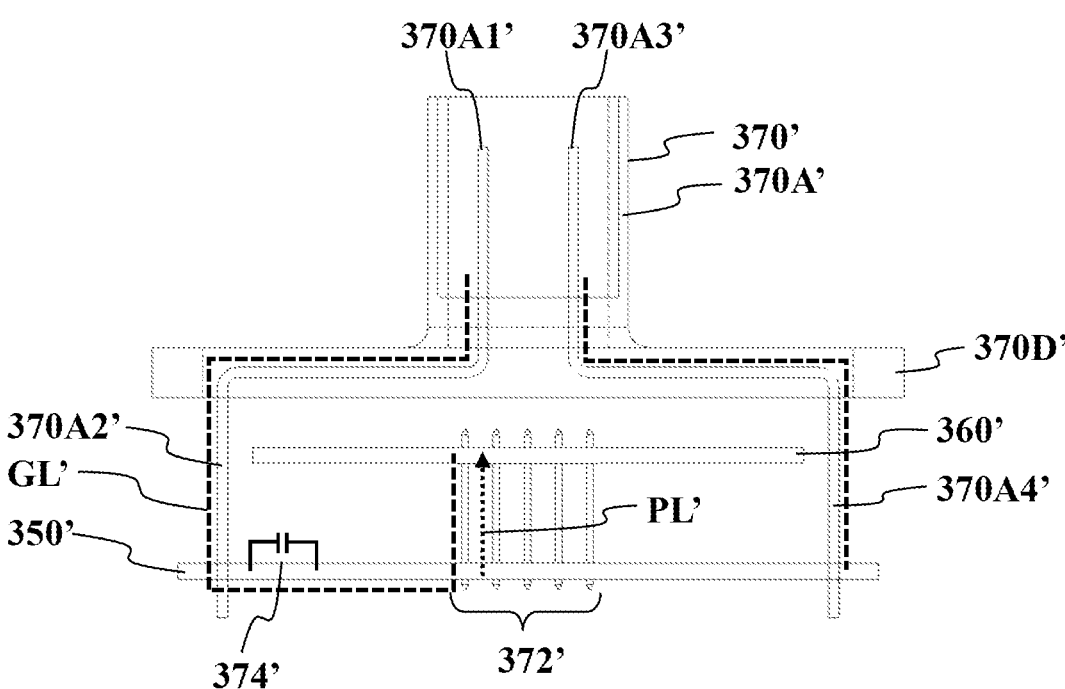
FIG. 15 is a longitudinal sectional view illustrating another example of the routing layout of ground lines.

FIG. 15 illustrates another example of electronic control device 340. In this example, to avoid confusion with the previous example, components different from those of the previous example will be described by reference symbols including "'" (prime mark).

One power supply connector 370A' and one control connector (not illustrated) are formed on a connector base 370D' of a connector unit 370'. A ground terminal 370A1' of power supply connector 370A' is connected to a ground (not illustrated) of a power supply board 350' via a busbar 370A2' that extends through the inside of connector base 370D' of connector unit 370' and bends toward power supply board 350'. A ground of power supply board 350' is connected to a ground (not illustrated) of a control board 360' via a signal transmission path for mutually transmitting signals between power supply board 350' and control board 360'. In the example illustrated in FIG. 15, the signal transmission path is one of a plurality of lead wires 372' (for example, a lead wire 372' located as the leftmost lead wire). Thus, ground terminal 370A1' of power supply connector 370A' is connected to the ground of control board 360' by way of the ground of power supply board 350', via a ground line GL' indicated by a dashed line on the left in FIG. 15. The ground line GL' is constituted by busbar 370A2', the ground of power supply board 350', and the above lead wire 372'. Furthermore, a capacitor 374' having a predetermined capacitance is disposed between busbar 370A2' and the ground of power supply board 350'. Capacitor 374' is an example of a noise reduction component.

A power supply terminal 370A3' of power supply connector 370A' is connected to a smoothing circuit of power supply board 350' via a busbar 370A4' that extends through the inside of connector base 370D' of connector unit 370' and bends toward power supply board 350' (see a dashed line on the right in FIG. 15). A power supply voltage smoothed by the smoothing circuit of power supply board 350' is supplied to control board 360' via a power supply line PL', which is one of the plurality of lead wires 372' (for example, a lead wire 372' located second from the left). Thus, the power supply voltage supplied to power supply terminal 370A3' of power supply connector 370A' is supplied to the smoothing circuit of power supply board 350' via busbar 370A4' and is then smoothed. The smoothed power supply voltage is supplied to control board 360' via power supply line PL'. In short, power supply terminal 370A3' of power supply connector 370A' is connected only to power supply board 350' to which ground terminal 370A1' is directly connected via busbar 370A2'.

With the above configuration, ground line GL' connected to ground terminal 370A1' of power supply connector 370A' is connected to the ground of control board 360' by way of the ground of power supply board 350'. Furthermore, since the noise is reduced by capacitor 374' disposed at the connection point where ground line GL1' is connected to power supply board 350', the noise superimposed on the current flowing through lead wire 372' connecting the ground of power supply board 350' and the ground of control board 360' is reduced. Therefore, there is no need to dispose a noise reduction component at the connection point where ground line GL' is connected to control board 360'. That is, compared with conventional techniques, the present example needs fewer noise reduction components while enabling easier routing of ground line GL'. Since the present example needs fewer noise reduction components, the present example achieves reduction in cost and size of electronic control device 340 and effective utilization of the mounding space for electronic components on the circuit boards.

Note that the present example in which electronic control device 340 does not have a redundant configuration is also applicable to other examples in which electronic control device 340 has a redundant configuration.

It will be easily understood by those skilled in the art that a new example can be created by omitting or appropriately combining some of the technical ideas of the examples described above or by replacing some of the technical ideas by known techniques.

For example, electronic control device 340 according to any one of the above examples can be applied not only to electric power steering system 100 but also to known systems such as an engine control system, an automatic transmission control system, and an autonomous driving system. In this case, at least smoothing circuits 350A and 350C are mounted on power supply board 350, and at least microcomputers 360A and 360D are mounted on control board 360.

Furthermore, the circuit boards included in electronic control device 340 are not limited to power supply board 350 and control board 360. Electronic control device 340 may include three or more circuit boards suitable for its control target system. Furthermore, a battery may be shared by the first system and the second system in the control system of electric power steering system 100 illustrated in FIGS. 13 and 14.

REFERENCE SYMBOL LIST

340 Electronic control device
350, 350' Power supply board
350A, 350C Smoothing circuit
360, 360' Control board
360A, 360D Microcomputer
360G Common ground
370A, 370A', 370B Power supply connector
370A1, 370A1', 370B1 Ground terminal
370A3, 370A3', 370B3 Power supply terminal
400, 420 Current detection element
DL1, DL2 Dropped volage line
GL1, GL2, GL' Ground line
PL1, PL2, PL' Power supply line
SL1, SL2 Signal line

The invention claimed is:
1. An electronic control device comprising:
a plurality of circuit boards that transmit signals to each other; and
a power supply connector for direct-current power,
wherein a ground line connected to a ground terminal of the power supply connector is connected to a ground of one of the plurality of circuit boards by way of a ground of another one of the plurality of circuit boards,
wherein a power supply terminal of the power supply connector is connected only to the circuit board to which the ground terminal of the power supply connector is directly connected, and
wherein a power supply line that supplies an input power source from the another one of the circuit boards to the one of the circuit boards and the corresponding ground line are disposed close to each other between the plurality of circuit boards.
2. The electronic control device according to claim 1,
wherein the plurality of circuit boards include a control board on which at least a microcomputer is mounted, and a power supply board on which at least a power source voltage smoothing circuit is mounted, and
wherein the ground line is connected to a ground of the control board by way of a ground of the power supply board.
3. The electronic control device according to claim 2,
wherein the power supply connector, the microcomputer, and the smoothing circuit are redundantly provided for two redundant systems,
wherein the ground of the control board serves as a common ground shared by the redundant systems, and
wherein a current detection element is disposed on each of the ground lines that connect the ground of the power supply board and the common ground of the control board in the systems, and the current detection elements detect currents that flow through their respective ground lines.
4. The electronic control device according to claim 1,
wherein the plurality of circuit boards include a control board on which at least a microcomputer is mounted, and a power supply board on which at least a power supply voltage smoothing circuit is mounted, and wherein the ground line is connected to a ground of the power supply board by way of a ground of the control board.
5. The electronic control device according to claim 1,
wherein the power supply line that supplies the input power source from the another one of the circuit boards to the one of the circuit boards, a dropped voltage line that supplies a voltage that is obtained by dropping the input power source in the one of the circuit boards to the another one of the circuit boards, and the corresponding ground line are disposed close to each other between the plurality of circuit boards.
6. The electronic control device according to claim 1,
wherein the power supply line that supplies the input power source from the another one of the circuit boards to the one of the circuit boards, a signal line that has a voltage approximately equal to the input power source supplied from the one of the circuit boards to the another one of the circuit boards, and the corresponding ground line are disposed close to each other between the plurality of circuit boards.
7. The electronic control device according to claim 1,
wherein the power supply line and the ground line are disposed with an interval therebetween, the interval being smaller than a thickness of any one of the circuit boards.
8. A ground line routing method for an electronic control device including a plurality of circuit boards that transmit signals to each other and a power supply connector for direct-current power, the method comprising:
connecting a ground line connected to a ground terminal of the power supply connector to a ground of one of the plurality of circuit boards by way of a ground of another one of the plurality of circuit boards,
connecting a power supply terminal of the power supply connector only to the circuit board to which the ground terminal of the power supply connector is directly connected, and
disposing a power supply line that supplies an input power source from the another one of the circuit boards to the one of the circuit boards and the corresponding ground line close to each other between the plurality of circuit boards.
9. The ground line routing method according to claim 8,
wherein the plurality of circuit boards include a control board on which at least a microcomputer is mounted, and a power supply board on which at least a power supply voltage smoothing circuit is mounted, and
wherein the method includes connecting the ground line to a aground of the control board by way of a ground of the power supply board.
10. The ground line routing method according to claim 9,
wherein the power supply connector, the microcomputer, and the smoothing circuit are redundantly provided for two redundant systems,
wherein the ground of the control board serves as a common ground shared by the redundant systems, and
wherein the method includes disposing a current detection element on each of the ground lines that connect the ground of the power supply board and the common ground of the control board in the systems, the current detection elements detecting currents that flow through their respective ground lines.
11. The ground line routing method according to claim 8,
wherein the plurality of circuit boards include a control board on which at least a microcomputer is mounted, and a power supply board on which at least a power supply voltage smoothing circuit is mounted, and

wherein the method includes connecting the ground line to a ground of the power supply board by way of a ground of the control board.

* * * * *